United States Patent [19]

Nagano et al.

[11] Patent Number: 4,886,874

[45] Date of Patent: Dec. 12, 1989

[54] POLYIMIDE HAVING EXCELLENT THERMAL DIMENSIONAL STABILITY

[75] Inventors: Hirosaku Nagano, Ootsu; Hideki Kawai; Kiyokazu Akahori, both of Kobe, all of Japan

[73] Assignee: Kanegafuchi Chemical Ind. Co., Ltd., Osaka, Japan

[21] Appl. No.: 146,161

[22] Filed: Jan. 20, 1988

[30] Foreign Application Priority Data

Jan. 20, 1987 [JP] Japan ................................. 62-8947
Jan. 20, 1987 [JP] Japan ................................. 62-8949
Jul. 13, 1987 [JP] Japan ............................. 62-174128

[51] Int. Cl.$^4$ ............................................. C08G 69/26
[52] U.S. Cl. ................................... 528/353; 528/128; 528/170; 528/171; 528/185; 528/187; 528/351
[58] Field of Search ............... 528/353, 128, 170, 172, 528/185, 187, 351

[56] References Cited

U.S. PATENT DOCUMENTS 4,255,313  3/1981  Antonoplos et al. ................ 528/353
4,299,750  11/1981  Antonoplos et al. ................ 528/353
4,405,770  9/1983  Schoenberg et al. .

OTHER PUBLICATIONS

Yang et al, Journal of Applied Polymer Science, vol. 31, pp. 979–995 (1986), "Synthesis and Properties of Copolypyromellitimides".

Primary Examiner—John Kight
Assistant Examiner—M. L. Moore
Attorney, Agent, or Firm—Armstrong, Nikaido, Marmelstein, Kubovcik & Murray

[57] ABSTRACT

A polyimide copolymer having a repeating unit of formula (I):

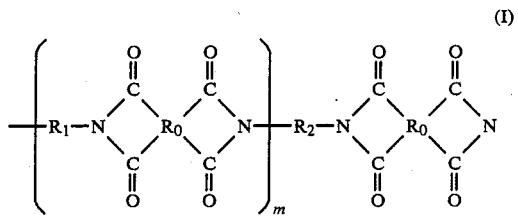

wherein each of $R_1$ and $R_2$ is independently

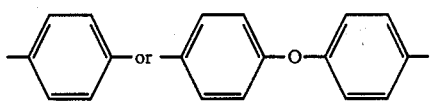

and $R_1$ and $R_2$ are different from each other, $R_0$ is an aromatic group having a valency of 4, and m is a positive integer. The polyimide copolymer is excellent in heat resistance, mechanical properties (e.g., tensile elongation) and thermal dimensional stability.

13 Claims, No Drawings

POLYIMIDE HAVING EXCELLENT THERMAL DIMENSIONAL STABILITY

BACKGROUND OF THE INVENTION

1. Field of the Invention

The present invention relates to a polyimide resin, which is known as a heat-resistant resin, and, more particularly, to a novel copolyimide possessing excellent thermal dimensional stability and mechanical properties.

2. Description of the Prior Art

Polyimides are well known as polymers having excellent heat resistance. These polymers also have good resistance to chemicals and good electrical and mechanical characteristics. A typical polyimide is prepared by means of condensation polymerization, using 4,4'-diaminodiphenyl ether and pyromellitic dianhydride, and is commercially available. This polymer is used for electrical materials requiring heat resistance, e.g., flexible printed circuit boards. Although the polymer has good mechanical characteristics such as high tensile properties, its thermal dimensional stability is poor (linear thermal expansion coefficient: $3 \times 10^{-5}/°C$.), which leads to problems such as warping and curling of flexible printed circuit boards.

A flexible printed circuit board comprises a polyimide film and a metal laminated thereon. Since the linear thermal expansion coefficient of the metal is less than that of the polyimide film, warping and curling occur due to changes in temperature during the fabrication and subsequent use of the flexible printed circuit boards.

Another problem caused by poor thermal dimensional stability of polyimides is warping or curling of a magnetic recording material. A recently developed high-density magnetic recording material is fabricated by depositing a metal on a base film. Since metal deposition is performed at a high temperature, a heat-resistant polymer such as a polyimide should preferably be used as the base film. However, since the linear thermal expansion coefficient of the polyimide film is greater than that of the metal, undesirable warping and curling inevitably occur.

Since polyimides have good heat resistance, they are usually treated at high temperature during their use. Consequently, demand has arisen for the fabrication of a polyimide which possesses excellent thermal dimensional stability. With the advance of electronics, in particular, demand for such a polyimde has only become stronger.

Examples of a polyimde having excellent thermal dimensional stability are disclosed in Japanese Patent Disclosure (Kodai) Nos. 61-158025, 61-181828, 61-241325, and 61-264028. In the preparation of the polyimides disclosed in Japanese Patent Disclosure (Kokai) Nos. 61-158025 and 61-264028, biphenyltetracarboxylic dianhydride and pyromellitic dianhydride (the latter is used if necessary) are used as tetracarboxylic dianhydrides, and paraphenylene diamine and 4,4'-diaminodiphenyl ether (the latter is used if necessary) are used as diamines. These materials are polycondensed to obtain the above polyimides. The polyimide disclosed in Japanese Patent Disclosure (Kokai) No. 61-181828 is prepared by using a specific heterocyclic diamine (e.g., 2,5-diaminopyridine) as diamine and polycondensing it with an aromatic tetracarboxylic dianhydride. The polyimide disclosed in Japanese Patent Disclosure (Kokai) No. 61-241325 is prepared by using 9,9-bis(4-aminophenyl)anthracene and paraphenylene diamine as diamines and polycondensing them with biphenyltetracarboxylic dianhydride as a tetracarboxylic dianhydride. The compounds, such as biphenyltetracarboxylic dianhydride, heterocyclic diamine, or 9,9-bis(4-aminophenyl)anthracene, used to prepare these polyimides are expensive.

SUMMARY OF THE INVENTION

It is an object of the present invention to provide a polyimide which has excellent thermal dimensional stability, and which can be produced by using conventional inexpensive starting materials.

It is another object of the present invention to provide a polyimide having excellent thermal dimensional stability and mechanical properties.

It is still another object of the present invention to provide a polyimide which has excellent mechanical properties and is free from warping or curling when a film composed of this polyimide is bonded to a metal.

In order to achieve the above objects of the present invention, there is provided a polyimide copolymer having a repeating unit represented by formula (I):

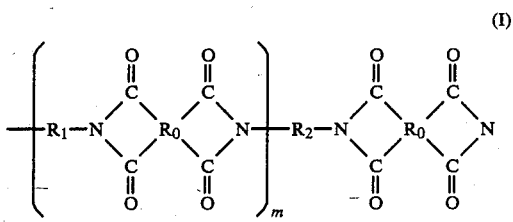

wherein each of $R_1$ and $R_2$ independently represents

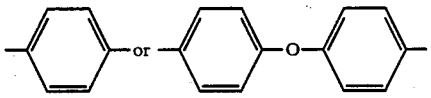

and $R_1$ and $R_2$ are different from each other; $R_0$ represents an aromatic group having a valency of 4; and m represents a positive integer.

The polyimide copolymer according to the present invention has excellent heat resistance, mechanical properties (e.g., tensile property), and thermal dimensional stability. In addition, it has a linear expansion coefficient of $2.5 \times 10^{-5}/°C$. or less in the temperature range of 50° C. to 300° C. and an elongation of 30% or more as tensile property. The polyimide copolymer of the present invention has a linear expansion coefficient of $2.0 \times 10^{-5}/°C$. or less and an elongation of 40% or more, and, more preferably, $1.5 \times 10^{-5}/°C$. or less and 50% or more. Further, the polyimide copolymer has a proper modulus for using as a flexible printed circuit board, a magnetic tape or a magnetic disk. In particular, even if the linear expansion coefficient is small, the modulus is not excessively increased. Thus, the polyimide copolymer of the present invention can be used in a variety of applications.

Although the reason why the polyimide copolymer has the above-mentioned properties has not yet been clarified, it may be explained as follows:

Since the polyimde copolymer of the present invention has a regularly arranged structure, in which block units of the copolyimide represented by the formula

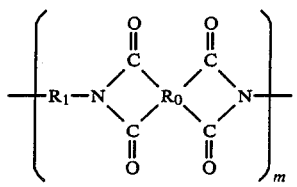

(wherein $R_0$, $R_1$, and m are as defined above) are linked by a repeating unit represented by the formula:

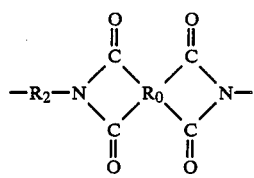

(wherein $R_0$ and $R_2$ are as defined above), the repeating units represented by the formula:

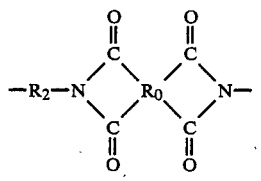

are uniformly distributed in the molecular chain. In other words, hard or soft segments are uniformly distributed on a molecular level. As a result, the thermal dimensional stability and the tensile property of the copolymer are both greatly improved. The polyimide copolymer of the present invention possesses superior thermal dimensional stability and mechanical characteristics compared to a polyimide copolymer prepared by random copolymerization using paraphenylene diamine and 4,4'-diaminodiphenyl ether as the diamines, or a mixture of a homopolymer of a polyimide prepared by using paraphenylene diamine as the diamine, and a polyimide prepared by using 4,4'-diaminodiphenyl ether as the diamine.

Each of $R_1$ and $R_2$ of the polymer of the present invention is independently a

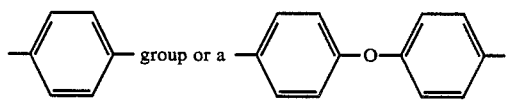

group; $R_1$ and $R_2$ being different from each other.

$R_0$ is an aromatic group having a valency of 4 in which carbon atoms forming an aromatic ring are associated with bonding, preferably $R_0$ is an aromatic group having $C_6$ to $C_{24}$ carbon atoms. Typical examples of the aromatic group are:

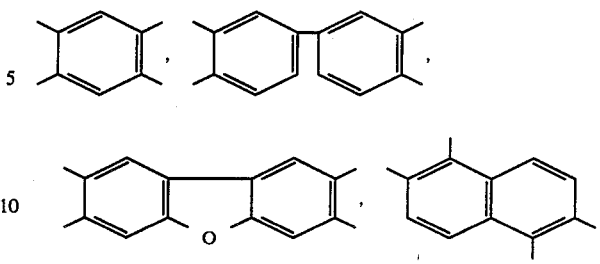

Among these aromatic groups,

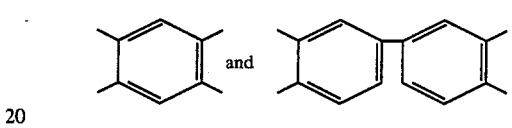

are preferable, in the case of the present invention, with the aromatic group

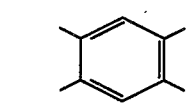

being the most preferred.

The repeating units represented by formula (I) are contained in the polymeric chain to an extent that the effect of the present invention is achieved. In general, a polymer containing the repeating units represented by formula (I) as the major constituent is preferred. The content of the repeating units is 50 wt% or more in one polymer molecule, preferably 80 wt% or more, and more preferably 90 wt% or more. The number m in the block unit is 1 to 9, preferably 1 to 7, and more preferably 1 to 4. If the m exceeds 9, the effect of copolymerization cannot be achieved. While a molecule of the copolymer can contain units where m is different, it is preferable that it contain units where m is the same. The molecular weight of the copolyimide is not limited to a specific value.

In order to maintain the high mechanical properties of the resultant polyimide resin, the number average molecular weight should be at least 50,000 or more, preferably 80,000 or more, more preferably 100,000 or more, and most preferably 120,000 or more. It is difficult to determine directly the molecular weight of the polyimide. The molecular weight of polyimide is estimated from the molecular weight of the corresponding polyamic acid.

While the copolyimide of the present invention can be prepared by various methods, it is preferable that it be prepared by use of a polyamic acid copolymer having repeating units represented by formula (II):

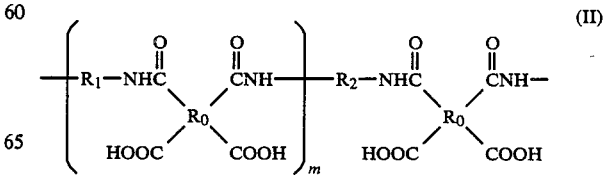

(II)

(wherein $R_0$, $R_1$, $R_2$, and m are as defined above).

A preferable method of manufacturing the copolyimide or the polyamic acid copolymer will now be described in detail.

Organic tetracarboxylic dianhydride (A) represented by formula:

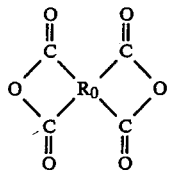

(wherein $R_0$ is as defined above)
is reacted with an insufficient molar amount, preferably 50 to 90 mol%, based on the organic tetracarboxylic dianhydride (A), of an organic diamine compound (B) represented by formula:

$$H_2N-R_1-NH_2$$

(wherein $R_1$ is as defined above)
in an organic polar solvent, thereby to obtain a prepolymer having acid anhydride groups at both its terminals. Then, an organic diamine compound (C) represented by formula:

$$H_2N-R_2-NH_2$$

(wherein $R_2$ is as defined above)
is added to the prepolymer such that total organic diamine ((B)+(C)) reacts with the organic tetracarboxylic dianhydride (A) substantially at an equimolar ratio, thereby obtaining a polyamic acid copolymer having repeating units represented by formula (II). This copolymer is thermally or chemically dehydrated and ring-closed to obtain a copolyimide.

For example, pyromellitic dianhydride is suspended and dissolved in an organic polar solvent, and 50 to 90 mol%, preferably 50 to 87.5 mol%, and more preferably 50 to 80 mol% of 4,4'-diaminodiphenyl ether, with respect to the pyromellitic dianhydride, are added to and made to react with the pyromellitic dianhydride, to obtain a solution of a prepolymer having acid anhydride groups at both terminals thereof. In the reaction for obtaining this prepolymer, the order of addition of pyromellitic dianhydride and 4,4'-diaminodiphenyl ether may be reversed. Then, paraphenylene diamine is added to the prepolymer such that the pyromellitic dianhydride is reacted with all the diamine substantially at an equimolar ratio. The resultant solution is stirred to obtain a polyamic acid copolymer solution. The concentration of the polyamic acid copolymer in the organic polar solvent is 5 to 35 wt% and preferably 10 to 25 wt%. In order to allow the above polymerization reaction to proceed stably, the reaction is preferably completed at 60° C. or less, preferably 30° C. or less, and more preferably 10° C. or less within 10 hours, preferably 5 hours, and more preferably 3 hours, in an anhydrous system. These conditions are used for the following reason:

Since the prepolymer having the acid anhydride terminals is produced as an intermediate during the reaction, the acid anhydride undesirably reacts with moisture in the system, thereby producing a dicarboxylic acid and preventing growth of the polymer chain.

In order to obtain the copolyimide from the solution of the polyamic acid copolymer as a precursor, thermal or chemical dehydration and ring closing may be performed. Such a process will now be described in detail.

When thermal dehydration and ring-closing (conversion into an imide) is performed, the polyamic acid copolymer solution is cast or coated as a film on a support body such as a support plate, a drum, or an endless belt, and the film is dried at 150° C. or less for about 30 to 90 minutes, resulting in a self-supporting film. This film is gradually heated to a temperature of about 200° to 500° C., preferably 300° to 500° C., and then cooled. The cooled film is removed from the support body, thereby producing a polyimide film made of the polyimide copolymer of the present invention.

When chemical dehydration and ring-closing (conversion into an imide) is performed, an amount exceeding a stoichiometric amount of a dehydrating reagent and a catalytic amount of a tertiary amine are added to the solution of the polyamic acid copolymer. The resultant solution is cast or coated on a drum or endless belt, thereby forming a film thereon. The film is dried at 150° C. or less for 5 to 30 minutes, resulting in a self-supporting film. This film is gradually heated to a temperature of about 200° to 500° C., preferably 300° to 500° C., and then cooled. The cooled film is peeled off from the drum or the belt, thereby producing a polyimide film made of the polyimide copolymer of the present invention.

Alternatively, the self-supporting film can be first peeled off from the support body, and then heated to a temperature of about 200° to 500° C., while being held at its edges. In this case, the resultant copolyimide film has a low linear expansion coefficient.

When the polyimides produced by the above two methods are compared, the polyimide produced by means of the chemical conversion method is found to have better mechanical properties and a lower linear expansion coefficient than the polyimide produced by means of the thermal conversion method.

The materials used in preparing the copolyimide of the present invention will now be described in detail. Examples of tetracarboxylic dianhydride for obtaining the polyamic acid copolymer as a precursor of the copolyimide of the present invention are pyromellitic dianhydride,
3,3',4,4'-biphenyltetracarboxylic dianhydride,
3,3,',4,4'-benzophenone tetracarboxylic dianhydride,
naphthalene-1,2,5,6-tetracarboxylic dianhydride and a mixture thereof.

Among these tetracarboxylic anhydride, pyromellitic dianhydride is preferred. It is also preferable to use pyromellitic dianhydride with another tetracarboxylic anhydride to an extent that the amount of the pyromellitic dianhydride is 50 weight % or more based on the total amount of the tetracarboxylic anhydride.

4,4'-Diaminodiphenyl ether and paraphenylene diamine are used as aromatic diamine components, to achieve the effect of the present invention, Other diamine compounds represented by the formula $$H_2N-R-NH_2$$

wherein R is an organic group having a valency of 2, can also be used. In this case, another diamine compound is used to an extent that the effects of the present invention is achieved. Examples of such amines are 4,4'-bis(4-aminophenoxy)biphenyl, 4,4'-diaminodiphenylsulfone, 3,3'-diaminodiphenylsulfone, bis[4-(4-aminophenoxy) phenyl]sulfone, bis[4-(3-aminophenoxy)phenyl]sulfone, bis[4-(2-aminophenoxy)phenyl]sulfone, 1,4-bis(4-aminophenoxy)benzene, 1,3-bis(4-aminophenoxy)benzene, 1,3-bis(3-aminophenoxy)benzene, 1,4-bis(4-aminophenyl)benzene, bis[4-(4-aminophenoxy) phenyl]ether, 4,4'-diaminodiphenylmethane, bis(3-ethyl-4-aminophenyl)methane, bis(3-methyl-4-aminophenyl)methane, bis(3-chloro-4-aminophenyl)methane, 3,3'-dimethoxy-4,4'-diaminobiphenyl, 3,3'-dimethyl-4,4'-diaminobiphenyl, 3,3'-dichloro-4,4'-diaminobiphenyl, 2,2',5,5'-tetrachloro-4,4'-diaminobiphenyl, 3,3'-dicarboxy-4,4'-diaminobiphenyl, 3,3'-dihydroxy-4,4'-diaminobiphenyl, 4,4'-diaminodiphenylsulfide, 3,3'-diaminodiphenyl ether, 4,4'-diaminobiphenyl, 4,4'-diaminooctafluorobiphenyl, 2,4-diaminotoluene, methaphenylene diamine, 2,2-bis[4-(4-aminophenoxy)phenyl]propane, 2,2-bis[4-(4-aminophenoxy)phenyl]hexafluoropropane, 2,2-bis(4-aminophenyl)propane, 2,2-bis(4-aminophenyl)hexafluoropropane, 2,2-bis(3-hydroxy-4-aminophenyl)propane, 2,2-bis(3-hydroxy-4-aminophenyl)hexafluoropropane, 9,9-bis(4-aminophenyl)-10-hydro-anthracene, orthotridinesulfone. Some polyamine compounds such as 3,3',4,4'-biphenyltetramine, 3,3',4,4'-tetraminodiphenyl ether may also be used.

Examples of the organic polar solvent used in the reaction for producing the polyamic acid copolymer include a sulfoxide solvent (e.g., dimethylsulfoxide or diethylsulfoxide), a formamide solvent (e.g., N,N-dimethylformamide or N,N-diethylformamide), an acetamide solvent (e.g., N,N-dimethylacetamide or N,N-diethylacetamide), a pyrrolidone solvent (e.g., N-methyl-2-pyrrolidone or N-vinyl-2-pyrrolidone), a phenol solvent (e.g., phenol, o-, m- or p-cresol, xylenol, halogenated phenol, or catechol), hexamethyl phosphoramide, and γ-butyrolactone. These organic polar solvents can be used singly or as a mixture. In addition, an aromatic hydrocarbon such as xylene or toluene may also be used.

Examples of the dehydrating reagent for chemically dehydrating and ring-closing the polyamic acid copolymer (conversion into an imide) include a fatty acid anhydride (e.g., acetic anhydride) and an aromatic acid anhydride. Examples of the catalyst include aliphatic tertiary amines (e.g., triethylamine), aromatic tertiary amines (e.g., dimethylaniline), and heterocyclic tertiary amines (e.g., pyridine, picoline, and isoquinoline).

The copolyimide according to the present invention has good thermal dimensional stability, high mechanical properties, and a proper modulus. As a result, the copolyimide film of the present invention can be successfully used as a flexible printed circuit board, a magnetic recording material (especially perpendicular magnetic recording material) such as a magnetic tape or a magnetic disk, and as a passivation film for ICs, LSIs, solar cells and the like.

EXAMPLE 1

10.31 g of 4,4-diaminodiphenyl ether (hereinafter referred to as ODA) were charged in a 500-ml four neck flask, and 145.00 g of N,N-dimethylacetamide were added thereto to dissolve the ODA. Meanwhile, 16.90 g of pyromellitic dianhydride (hereinafter referred to as PMDA) were added to a 50-ml eggplant type flask and were added in solid form to the ODA solution. The PMDA attached to the inner wall surface of the 50-ml eggplant type flask was dissolved in 10.00 g of N,N-dimethylacetamide, this solution was poured into the reaction system (i.e., the four-neck flask), and the mixture was stirred for one hour, to thereby obtain an amic acid prepolymer having acid anhydride group terminals. 2.79 g of paraphenylene diamine (hereinafter referred to as P-PDA) were charged in a 50-ml Erlenmeyer flask, and 15.00 g of N,N-dimethylacetamide were added to dissolve the P-PDA. The resultant solution was added to the reaction system (i.e., the four-neck flask), whereby a copolyamic acid solution was obtained. In the above reactions, the reaction temperature was 5° to 10° C., with dry nitrogen gas being used to treat the PMDA and to fill the reaction system.

The polyamic acid solution was cast and coated on a glass plate, and dried at about 100° C. for about 60 minutes, after which the resultant polyamic acid film was peeled off the glass plate. Thereafter, the film was fixed in a frame and dried at about 100° C. for 30 minutes, at about 200° C. for about 60 minutes, and at about 300° C., again for about 60 minutes. The film was dehydrated and subjected to ring closing, resulting in a polyimide film having a thickness of 15 to 25 μm.

The linear thermal expansion coefficient, the elongation break, and the modulus of the film are summarized in Table 1. Note that the linear thermal expansion coefficient was obtained at 200° C.

EXAMPLE 2

A copolyimide film was obtained following the same procedures as in Example 1, except that 8.07 g of the ODA, 17.58 g of the PMDA, and 4.35 g of the P-PDA were used. The properties of this film are summarized in Table 1.

EXAMPLE 3

4.35 g of P-PDA were charged in a 500-ml four neck flask, and 110.00 g of N,N-dimethylacetamide were added to dissolve the P-PDA solution. 17.58 g of the PMDA were charged in a 50-ml eggplant type flask and were added in solid form to the P-PDA. The PMDA attached to the inner wall surface of the 50-m eggplant type flask was dissolved in 10.00 g of N,N-dimethylacetamide, and this solution was poured into the reaction system (i.e., the four-neck flask). The resultant mixture was stirred for one hour, to obtain an amic acid prepolymer having acid anhydride group terminals. Meanwhile, 8.07 g of the ODA were charged in a 100-ml Erlenmeyer flask, and 50.00 g of N,N-dimethylacetamide were added thereto to dissolve the ODA. The resultant solution was added to the reaction system (i.e., the four-neck flask), whereby a copolyamic acid solution was obtained. In the above reactions, the reaction temperature was 5° to 10° C., with dry nitrogen gas being used to treat the PDMA and to fill the reaction system. A copolyimide film was obtained following the same procedures as in Example 1. The properties of this film are summarized in Table 1.

EXAMPLE 4

A copolyimide film was obtained following the same procedures as in Example 1, except that 12.02 g of the ODA, 16.36 g of the PMDA, and 1.62 g of the P-PDA were used. The properties of this film are summarized in Table 1.

EXAMPLE 5

A copolyimide film was obtained following the same procedures as in Example 3, except that 6.06 g of the P-PDA, 18.33 g of the PMDA, and 5.61 g of the ODA were used. The properties of this film are summarized in Table 1.

EXAMPLE 6

33.88 g of acetic anhydride and 5.32 g of pyridine were added to the polyamic acid solution obtained by the method of Example 2.

The polyamic acid solution composition was cast and coated on a glass plate, and dried at about 100° C. for approximately 10 minutes. The resultant self-supporting film was peeled off the plate and was fixed to a support frame. The film was then heated at about 200° C. for approximately 10 minutes, and at about 300° C. for approximately 20 minutes, resulting in a polyimide film having a thickness of 15 to 25 μm. The properties of this film are summarized in Table 1.

COMPARATIVE EXAMPLE 1

21.54 g of ODA were charged in a 500-ml four-neck flask, and 245.00 g of N,N-dimethylacetamide were added thereto to dissolve the ODA. Meanwhile, 23.46 g of PMDA were charged in a 100-ml eggplant type flask and were added in solid form to the ODA solution. The PMDA attached to the inner wall surface of this 100-ml eggplant type flask was dissolved in 10.00 g of N,N-dimethylacetamide, and this solution was poured into the reaction system (i.e., the four-neck flask). The resultant solution was kept stirred for one hour, whereby a polyamic acid solution was obtained. The reaction temperature was kept at 5° to 10° C., and dry nitrogen gas was used to treat the PDMA and to fill the reaction system.

Following the same procedures as in Example 1, a polyimide film was prepared from the resultant polyamic acid solution. The properties of this film are summarized in Table 1.

COMPARATIVE EXAMPLE 2

4.35 g of P-PDA and 8.07 g of ODA were charged in a 500-ml four-neck flask, and 160.00 g of N,N-dimethylacetamide were added thereto to dissolve the P-PDA and the ODA. 17.58 g of PMDA were added to the P-PDA and ODA solution following the same procedures as in Comparative Example 1, whereby a copolyamic acid solution was produced by random copolymerization.

Following the same procedures as in Comparative Example 1, a copolyimide film was prepared from the copolyamic acid solution. The properties of this film are summarized in Table 1.

COMPARATIVE EXAMPLE 3

6.96 g of P-PDA and 4.30 g of ODA were charged in a 500-ml four-neck flask, and 160.00 g of N,N-dimethylacetamide were added thereto to dissolve the P-PDA and the ODA. 18.73 g of PMDA were added to P-PDA and ODA solution following the same procedures as in Comparative Example 1, whereby a copolyamic acid solution was obtained by random copolymerization.

Following the same procedures as in Comparative Example 1, a copolyimide film was prepared from the polyamic acid solution. The properties of this film are summarized in Table 1.

COMPARATIVE EXAMPLE 4

21.54 g of ODA wre charged in a 500-ml four-neck flask, and 245.00 g of N,N-dimethylacetamide were added thereto to dissolve the ODA. Meanwhile, 23.46 g of PMDA were charged in a 100-ml eggplant type flask and were added in the solid form to the ODA solution. The PMDA attached to the inner wall surface of this 100-ml eggplant type flask was dissolved in 10.00 g of N,N-dimethylacetamide and the resultant solution was poured into the reaction system (i.e., the four neck flask). The solution was kept stirred for one hour, whereby polyamic acid solution (I) was obtained.

14.91 g of P-PDA were charged in an another 500-ml four-neck flask, and 245.00 g of N,N-dimethylacetamide were added thereto to dissolve the P-PDA. 30.09 g of PMDA were reacted with P-PDA following the same procedures as described above, whereby polyamic acid solution (II) was obtained. In all the above reactions, the reaction temperature was kept at 5° to 10° C., and dry nitrogen gas was useed to treat the PMDA and to fill the reaction system.

112.35 g of polyamic acid solution (I) were poured into another 500-ml four-neck flask, and 87.65 g of polyamic acid solution (II) were added thereto and mixed. The mixture was kept stirred at 5° to 10° C. for about 10 minutes in the presence of dry nitrogen gas.

Following the same procedures as in Example 1, a polyimide film was prepared from the polyamic acid mixture solution. The properties of this film are summarized in Table 1.

TABLE 1

| Example | OPA: P-PDA (Molar Ratio) | Amic Acid Prepolymer Used Diamine | Diamine: Acid Dianhydride (Molar Ratio) | Linear Thermal Expansion Coefficient (cm/cm/°C.) (× 10$^{-5}$) | Elongation Break (%) | Modulus (kg/mm$^2$) |
|---|---|---|---|---|---|---|
| Example 1 | 67:33 | ODA | 67:100 | 0.89 | 57.0 | 450 |
| Example 2 | 50:50 | ODA | 50:100 | 0.30 | 48.0 | 590 |
| Example 3 | 50:50 | p-PDA | 50:100 | 0.30 | 48.0 | 580 |
| Example 4 | 80:20 | ODA | 80:100 | 0.97 | 72.0 | 410 |
| Example 5 | 33:67 | p-PDA | 67:100 | 0.00 | 35.5 | 860 |
| Example 6 | 50:50 | ODA | 50:100 | 0.28 | 55.0 | 620 |
| Comparative Example 1 | 100:0 | — | — | 3.5 | 85.7 | 360 |
| Comparative Example 2 | 50:50 | — | — | 0.09 | 20.0 | 550 |
| Comparative Example 3 | 25:75 | — | — | 0.20 | 18.0 | 950 |
| Comparaitve Example 4 | 50:50 | — | — | 0.69 | 14.7 | 520 |

What is claimed is:

1. A polyimide copolymer containing repeating units of formula (I)

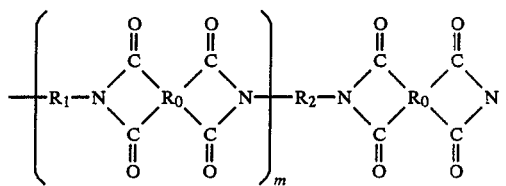

wherein each of $R_1$ and $R_2$ is independently

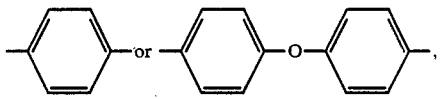

and $R_1$ and $R_2$ are different from each other; $R_0$ is an aromatic group having a valency of 4; and m is a positive integer.

2. A polyimide copolymer according to claim 1, wherein $R_0$ is

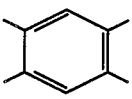

3. A polyimide copolymer according to claim 1, wherein $R_1$ is

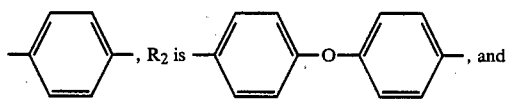

$R_0$ is 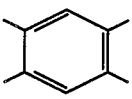

4. A polyimide copolymer according to claim 1, wherein $R_1$ is

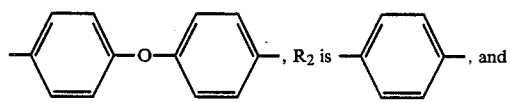

$R_0$ is

5. A polyimide copolymer according to claim 1, wherein, on the average, one molecule of the copolymer contains not less than 50 wt% of the repeating units of formula (I).

6. A polyimide copolymer according to claim 1, wherein m is an integer of 1 to 9.

7. A polyimide copolymer according to claim 1, wherein a number average molecular weight is not less than 50,000.

8. A polyamic acid copolymer containing repeating units of formula (II)

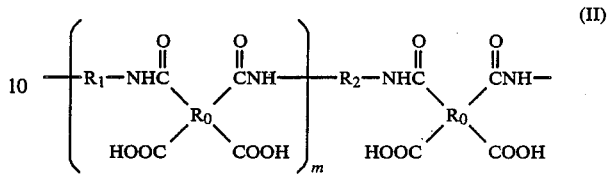

wherein each of $R_1$ and $R_2$ is independently

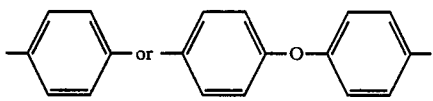

and $R_1$ and $R_2$ are different from each other; $R_0$ is an aromatic group having a valency of 4; and m is a positive integer.

9. A polyamic acid copolymer according to claim 8, wherein $R_0$ is

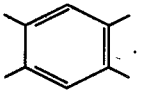

10. A polyamic acid copolymer according to claim 8, wherein $R_1$ is

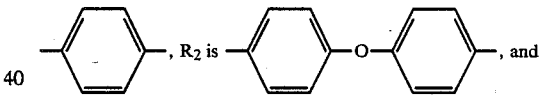

$R_0$ is

11. A polyamic acid copolymer according to claim 8, wherein $R_1$ is

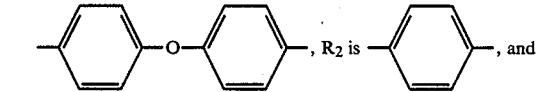

$R_0$ is

12. A polyamic acid copolymer according to claim 8, wherein m is an integer of 1 to 9.

13. A polyamic acid copolymer according to claim 8, wherein the number average molecular weight of the corresponding polyimide copolymer is not less than 50,000.